(12) United States Patent
Satoh et al.

(10) Patent No.: US 8,609,500 B2
(45) Date of Patent: Dec. 17, 2013

(54) SEMICONDUCTOR DEVICE PRODUCTION METHOD

(75) Inventors: Shigeo Satoh, Kunitachi (JP); Takae Sukegawa, Kokubunji (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/447,808

(22) Filed: Apr. 16, 2012

(65) Prior Publication Data

US 2012/0319182 A1  Dec. 20, 2012

(30) Foreign Application Priority Data

Jun. 15, 2011  (JP) .................................. 2011-133564

(51) Int. Cl.
*H01L 21/336* (2006.01)

(52) U.S. Cl.
USPC .......................................... 438/303; 257/288

(58) Field of Classification Search
USPC ..................... 438/303; 257/E29.255, E21.409
See application file for complete search history.

(56) References Cited

U.S. PATENT DOCUMENTS

| 7,315,062 B2 | 1/2008 | Ohtake |
| 7,446,043 B2 * | 11/2008 | Park et al. ...................... 438/682 |
| 2008/0272408 A1 * | 11/2008 | Vora ............................... 257/272 |
| 2009/0194817 A1 * | 8/2009 | Lee et al. ....................... 257/369 |
| 2009/0239327 A1 * | 9/2009 | Oh et al. ......................... 438/59 |

FOREIGN PATENT DOCUMENTS

| JP | 2001-007327 A | 1/2001 |
| JP | 2005-294584 A | 10/2005 |
| JP | 2006-310580 A | 11/2006 |
| JP | 2009-302548 A | 12/2009 |

* cited by examiner

*Primary Examiner* — Thao P. Le
(74) *Attorney, Agent, or Firm* — Westerman, Hattori, Daniels & Adrian, LLP

(57) ABSTRACT

A semiconductor device production method includes: forming in a silicon substrate first and second region of first and second conductivity type in contact with each other; forming a gate electrode above the first and the second region; forming an insulation film covering part of the gate electrode and part of the second region; forming a source region and a drain region of the second conductivity type; forming interlayer insulation film covering the gate electrode and the insulation film; and forming in the interlayer insulation film first, second and third contact hole reaching the source region, the drain region, and the gate electrode, respectively, and at least one additional hole reaching the insulation film, and forming a conductive film in the first, the second, and the third contact hole and the additional hole to form first, second and third electrically conductive via and electrically conductive member.

12 Claims, 16 Drawing Sheets

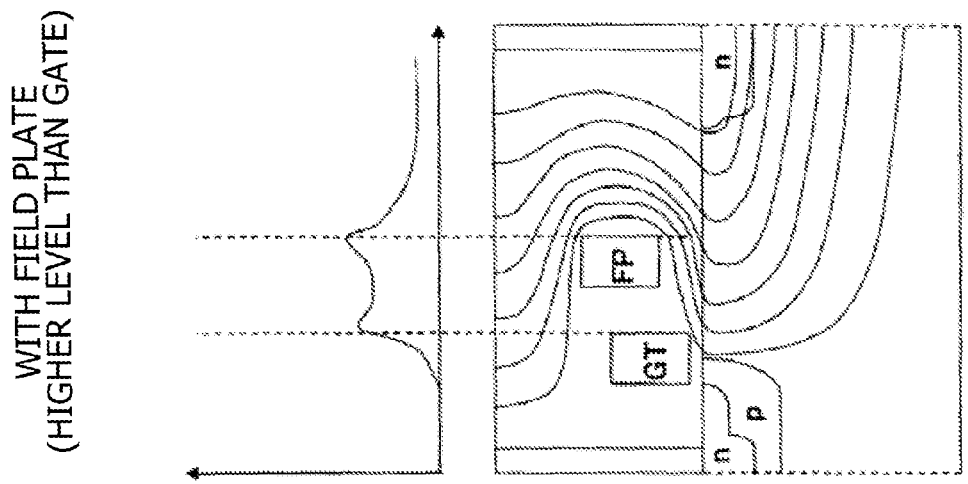
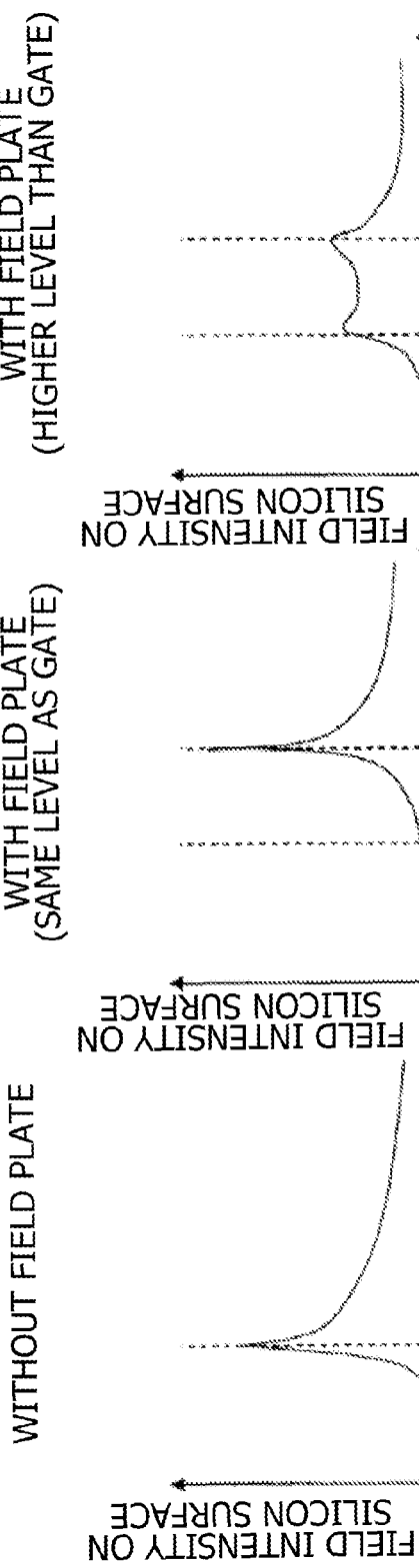
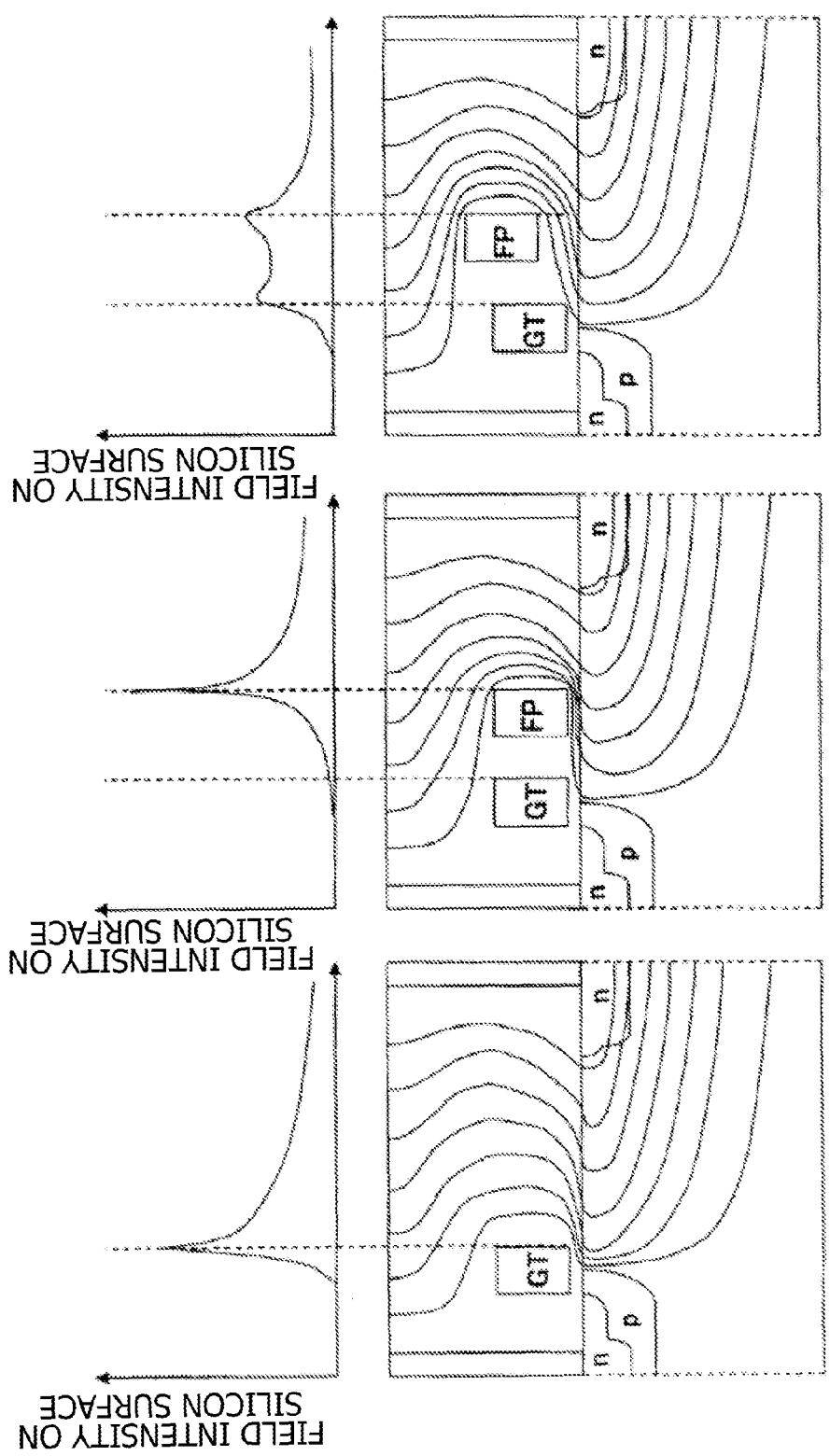

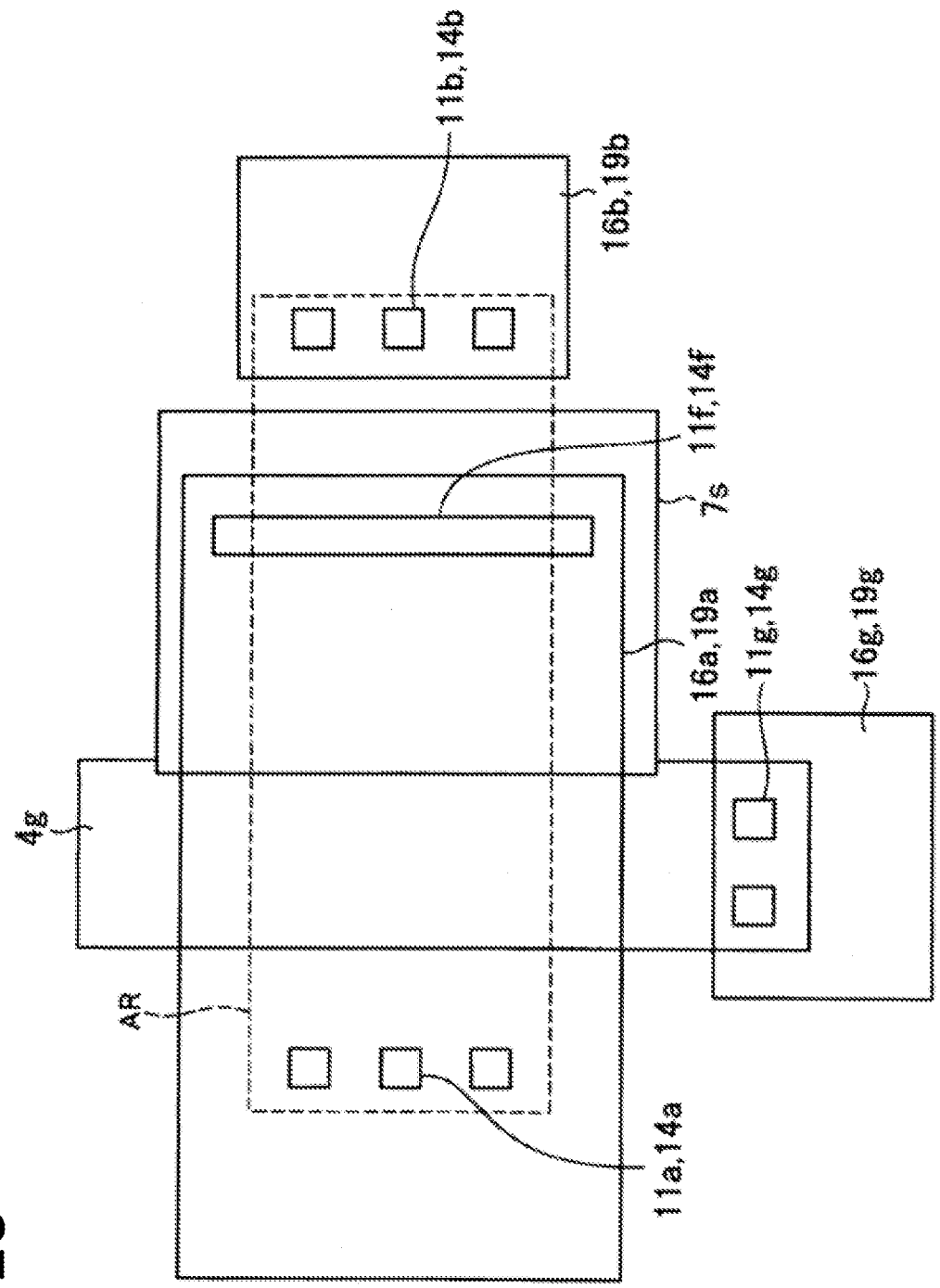

SEMICONDUCTOR DEVICE PRODUCTION METHOD

CROSS-REFERENCE TO RELATED APPLICATION

This application is based upon and claims the benefit of priority of the prior Japanese Patent Application No. 2011-133564, filed on Jun. 15, 2011, the entire contents of which are incorporated herein by reference.

FIELD

The embodiments discussed herein are related to a semiconductor device production method and a semiconductor device.

BACKGROUND

MOS transistors with improved withstanding voltage characteristics have recently been developed (for instance, see Japanese Patent Laid-open Publication No. 2005-294584). As an example, an n-type MOS transistor is illustrated below. If a low concentration n-type region is located between the p-type region, which acts as channel region, and the n-type drain region, moderate changes in voltage takes place in the low concentration n-type region, serving to improve the withstanding voltage characteristics. In addition, the use of a field plate has been proposed as a means of reducing the electric field concentration that occurs in the vicinity of the drain-side edge of the gate electrode (for instance, see Japanese Patent Laid-open Publications No. 2006-310580, No. 2001-7327, and No. 2009-302548).

An insulating film is formed on the low concentration n-type region, and another electrode called field plate is formed on this insulating film. Application of voltage to the field plate moderates the changes in the vicinity of the drain-side edge of the gate electrode, which serves to improve the withstanding voltage characteristics of the MOS transistor.

In Japanese Patent Laid-open Publication No. 2006-310580, the gate insulation film is shared by the field plate which uses it as the aforementioned underlying insulation film. With this technique, however, it is difficult to adjust the thickness of the insulation film under the field plate independently of the gate insulation film.

In Japanese Patent Laid-open Publication No. 2001-7327, an insulation film is formed under the field plate by thermal oxidation independently of the gate insulation film. This technique, however, requires a thermal oxidation step to form an underlying insulation film for the field plate.

SUMMARY

According to an aspect of the invention, a semiconductor device production method includes: forming in a silicon substrate a first region of a first conductivity type and a second region of a second conductivity type which is in contact with the first region; forming a gate electrode above the first region and the second region; forming an insulation film extending from the gate electrode to the second region to cover part of the gate electrode and part of the second region; forming a source region and a drain region by implanting impurity of the second conductivity type into the silicon substrate using the gate electrode as mask; forming a metal layer on the silicon substrate to cover the gate electrode and the insulation film; performing heat treatment after the metal layer formation to produce silicide on the source region, on the drain region, and on the gate electrode; after performing heat treatment, forming on the silicon substrate an interlayer insulation film to cover the gate electrode and the insulation film; forming in the interlayer insulation film a first contact hole reaching the source region, a second contact hole reaching the drain region, a third contact hole reaching the gate electrode, and at least one additional hole reaching the insulation film, and forming a conductive film in the first, the second, and the third contact hole and the additional hole to form a first, a second and a third electrically conductive via in the first, the second, and the third contact hole and to form an electrically conductive member in the additional hole.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 3A to 3C are schematic views of the electric field and equipotential lines in the vicinity of the gate electrode in the first and second comparative examples and the first embodiment, respectively.

FIG. 10 is a schematic plan view of a semiconductor device according to the fourth embodiment.

DESCRIPTION OF EMBODIMENTS

Figure 1A:
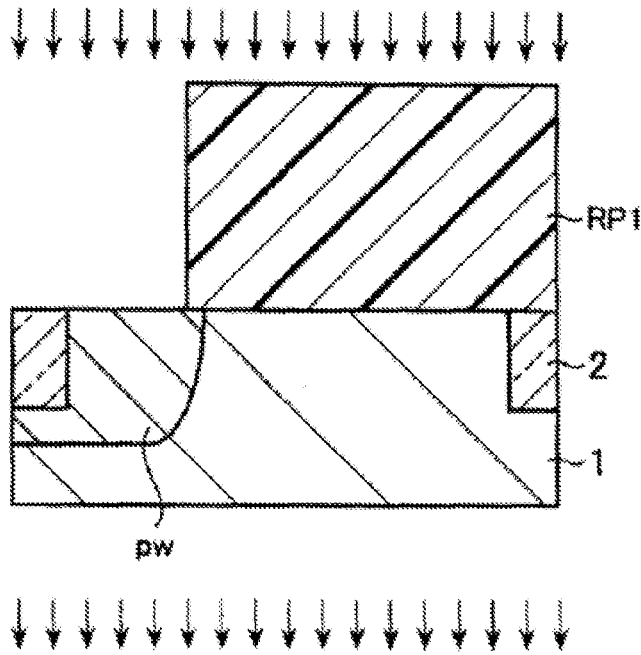
FIGS. 1A to 1N are schematic cross sections that illustrate major production steps for a semiconductor device according to the first embodiment.

First, the semiconductor device according to the first embodiment of the invention is described. FIGS. 1A to 1N are schematic cross sections that illustrate major production steps for a semiconductor device according to the first embodiment.

Refer to FIG. 1A. For instance, element-separating insulation film 2 of silicon oxide is formed on a semiconductor substrate 1 by shallow trench isolation (STI). The semiconductor substrate 1 is, for instance, a p-type silicon substrate.

Impurity of p-type is implanted in the substrate 1 to form p-type well pw. For instance, the p-type well pw is formed as follows. A resist pattern RP1 is formed to expose the region where the p-type well pw is to be produced. Using the resist pattern RP1 as mask, boron (B) is implanted three times under the conditions of an implantation energy of 400 keV and a doze of $1\times10^{13}$ cm$^{-2}$, implantation energy of 150 keV and a doze of $5\times10^{12}$ cm$^{-2}$, and implantation energy of 15 keV and a doze of $1\times10^{13}$ cm$^{-2}$. The resist pattern RP1 is removed after the production of the p-type well pw.

Figure 1B:
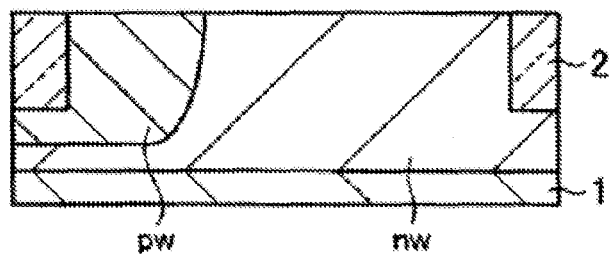

Refer to FIG. 1B. Impurity of n-type is implanted in the substrate 1 to form n-type well nw. For instance, the n-type well nw is formed as follows. Phosphorus (P) is implanted into the entire substrate twice under the conditions of an implantation energy of 500 keV and a doze of $2\times10^{12}$ cm$^{-2}$ and an implantation energy of 15 keV and a doze of $1\times10^{12}$ cm$^{-2}$.

Figure 1C:
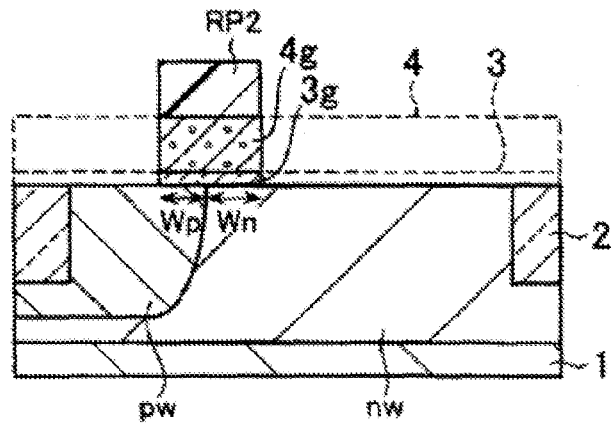

Refer to FIG. 1C. For instance, a gate insulation film 3 is formed on the silicon substrate 1 by carrying out thermal oxidation to grow a silicon oxide film with a thickness of 10 nm. For instance, an electrically conductive film 4 is formed on the gate insulation film 3 by carrying out chemical vapor deposition (CVD) to deposit a polysilicon film with a thickness of 100 nm.

A resist pattern RP2 having the same shape as the intended gate electrode is formed on the electrically conductive film 4. Using the resist pattern RP2 as mask, the electrically conductive film 4 is patterned by, for instance, etching with a mixed gas of HBr and $O_2$ to form a gate electrode 4g. The gate electrode 4g bridges the p-type well pw and the n-type well nw, the gate length being, for instance, 1 μm, and the length Wp of its overlap with the p-type well pw and the length Wn of its overlap with the n-type well nw being, for instance, 0.6 μm and 0.4 μm, respectively. This etching also patterns the gate insulation film 3 into a gate insulation film 3g that has the same shape as the gate electrode 4g. Subsequently, the resist pattern RP2 is removed.

Figure 1D:
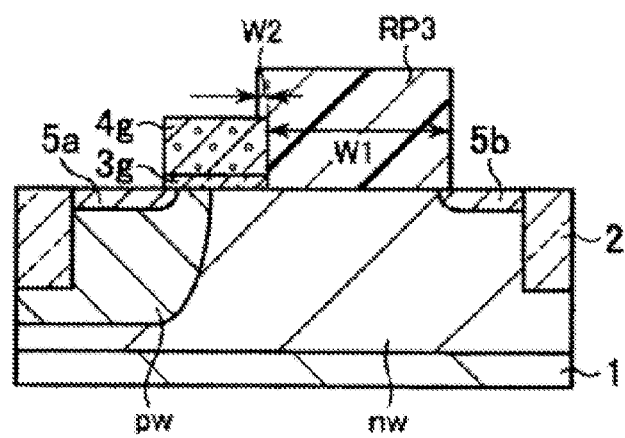

Refer to FIG. 1D. A resist pattern RP3 which serves as mask for LDD implantation is formed on the n-type well nw outside the gate electrode 4g. The resist pattern RP3 is located on the n-type well nw and extends to the edge of the gate electrode 4 facing to the n-type well nw.

The resist pattern RP3 extends on the n-type well nw over a width W1 from the side face of the gate electrode 4, the width W1 being long enough to maintain a junction with adequate withstanding voltage characteristics and being, for instance, 0.9 μm. There is an overlap of the resist pattern RP3 hanging over the edge of the gate electrode 4g facing toward the n-type well nw in order to prevent ions from being implanted in the n-type well nw even if the edge of the resist pattern RP3 is displaced, and its width W2 is, for instance, 0.1 μm.

LDD implantation is performed using the gate electrode 4g and resist pattern RP3 as mask. The LDD implantation conditions include, for instance, implantation of phosphorus (P) as n-type impurity at an implantation energy of 5 keV to a doze of $1\times10^{14}$ cm$^{-2}$. With the gate electrode 4g and resist pattern RP3 located in between, an LDD region 5a is formed in the p-type well pw outside the gate electrode 4g while another LDD region 5b is formed in the n-type well nw outside the resist pattern RP3. The n-type impurity is also implanted in the top face of the gate electrode 4g. Subsequently, the resist pattern RP3 is removed.

Figure 1E:
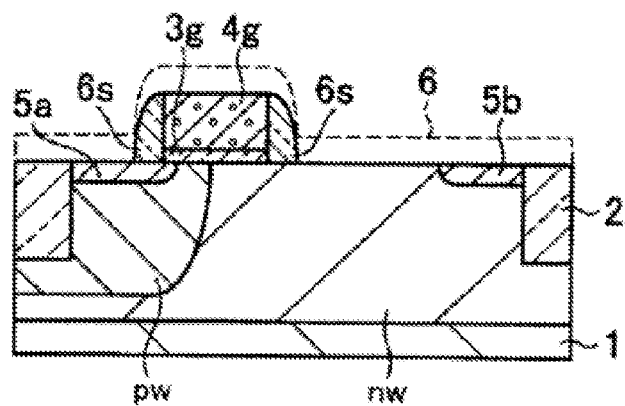

Refer to FIG. 1E. For instance, an insulation film 6 that covers the gate electrode 4g is formed on the substrate 1 by carrying out CVD to deposit a silicon oxide film with a thickness of 80 nm. Then, the insulation film 6 is etched anisotropically to form side wall spacers 6s on the side faces of the gate electrode 4g.

Figure 1F:
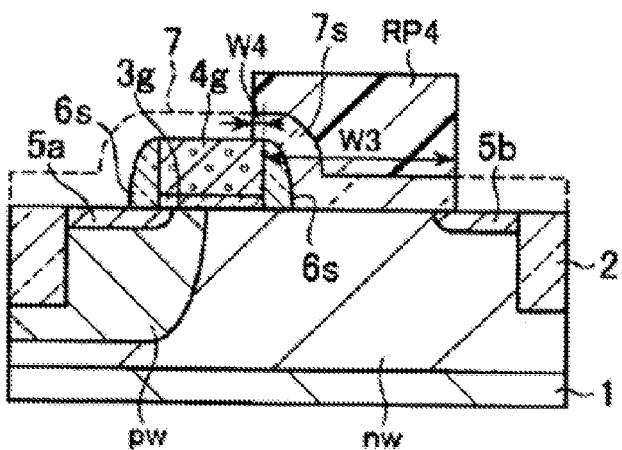

Refer to FIG. 1F. For instance, an insulation film 7 that covers the gate electrode 4g and the side wall spacers 6s is formed on the substrate 1 by carrying out CVD to deposit a silicon oxide film with a thickness of 40 nm to 80 nm (for instance, 60 nm). A resist pattern RP4 having the same shape as the intended silicide block layer is formed on the insulation film 7. Using the resist pattern RP4 as mask, the insulation film 7 is etched to form a silicide block layer 7s. The silicide block layer 7s serves as mask in the subsequent source/drain implantation step and also serves as mask to protect the silicide formation portion in the silicide formation step. Subsequently, the resist pattern RP4 is removed.

The silicide block layer 7s extends from the n-type well nw to cover the side wall spacer 6s located on the n-type well nw and also cover the edge of the gate electrode 4g facing toward the n-type well nw. The silicide block layer 7s extends on the n-type well nw over a width W3 from the side face of the gate electrode 4g, the width W3 being long enough to maintain a junction with adequate withstanding voltage characteristics and being, for instance, 1 μm. There is an overlap of the silicide block layer 7s hanging over the edge of the gate electrode 4g facing toward the n-type well nw in order to prevent ions from being implanted in the n-type well nw even if the edge of the silicide block layer 7s is displaced and to prevent silicide from being formed on the n-type well nw, and its width W4 is, for instance, 0.1 μm.

Figure 1G:
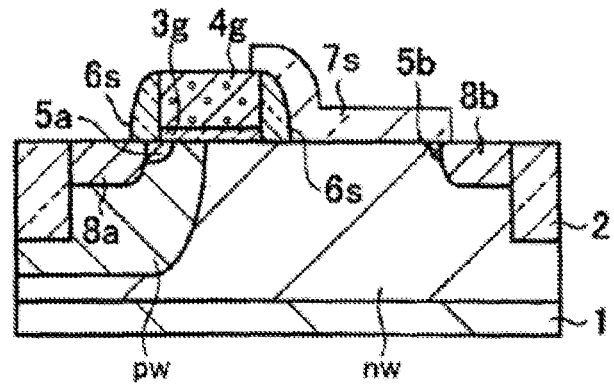

Refer to FIG. 1G. Source/drain implantation is carried out using the side wall spacer 6s on the p-type well pw, gate electrode 4g, and silicide block layer 7s as mask. The source/drain implantation conditions include, for instance, implantation of phosphorus (P) as n-type impurity at an implantation energy of 8 keV to a doze of $2\times10^{15}$ cm$^{-2}$. With the side wall spacer 6s on the p-type well pw, gate electrode 4g, and silicide block layer 7s located in between, a source/drain region 8a is formed in the p-type well pw outside the gate electrode 4g while another source/drain region 8b is formed in the n-type well nw outside the silicide block layer 7s. The n-type impurity is also implanted in the top face of the gate electrode 4g.

The n-type well nw is sandwiched between the p-type well pw, which acts as channel region, and the combination of n-type LDD region 5b and n-type source/drain region 8b, to form a transistor structure with high withstanding voltage characteristics. The formation of the source/drain regions 8a and 8b is followed by, for instance, annealing at 1,000° C. for 3 seconds.

Figure 1H:
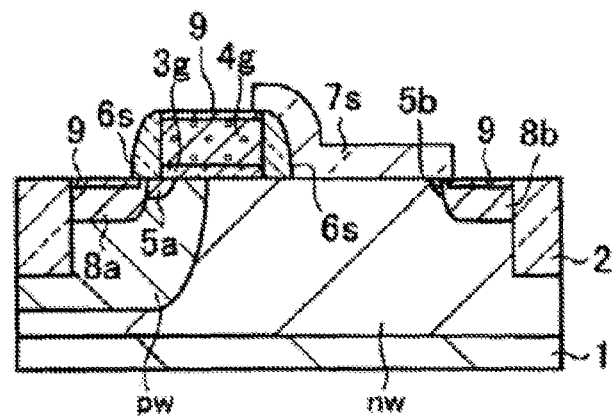

Refer to FIG. 1H. For instance, a metal layer, such as a nickel layer, is formed over the entire substrate and heat-treated to produce a silicide 9 of nickel silicide. The silicide 9 is formed on top of the source/drain regions 8a and 8b and the gate electrode 4g. The silicide block layer 7s works as mask for the silicide formation.

Figure 1I:
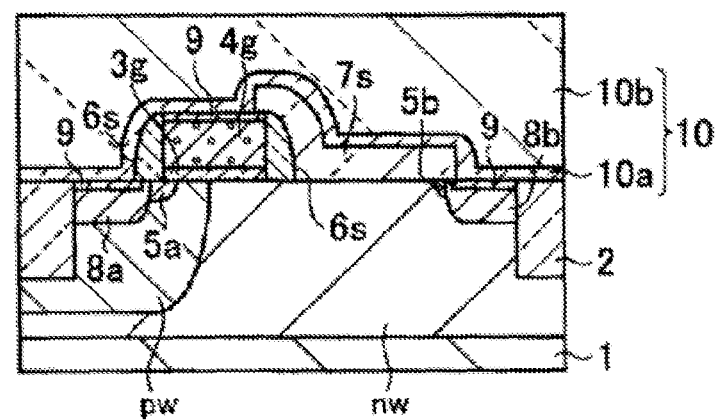

Refer to FIG. 1I. For instance, an insulation film 10a that covers the side wall spacer 6s, gate electrode 4g, and silicide block layer 7s and acts as contact etch stop liner layer is formed on the substrate 1 by carrying out CVD to deposit a silicon nitride film with a thickness of 20 nm to 40 nm (for instance, 30 nm). For instance, an interlayer insulation film 10b is formed on the insulation film 10a by carrying out CVD to deposit a silicon oxide film with a thickness of 300 nm to 600 nm (for instance, 400 nm). Chemical mechanical polishing (CMP) is carried out to planarize the top face of the interlayer insulation film 10b. The combination of the insulation films 10a and 10b may be referred to as the interlayer insulation film 10.

Figure 1J:
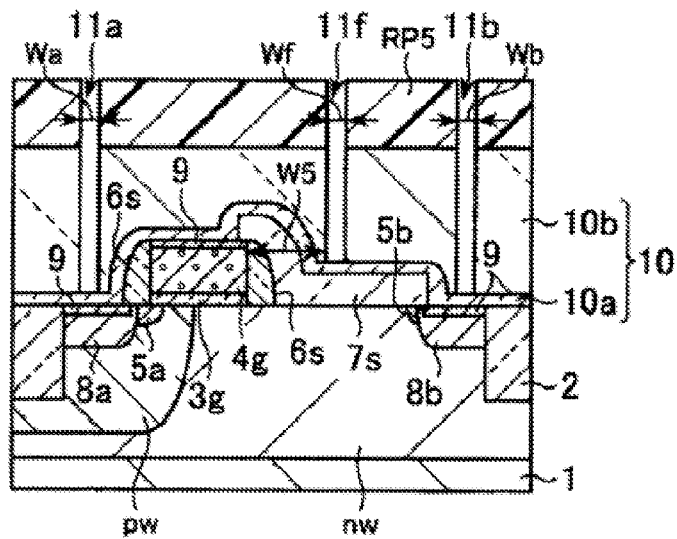

Refer to FIG. 1J. A resist pattern RP5 is formed on the insulation film 10b. The resist pattern RP5 has apertures having the same shape as the contact holes 11a and 11b and the hole 11f for field plate formation, and also has an aperture having the same shape as the contact hole 11g.

Electrically conductive vias 14a, 14b, and 14g, and a field plate 14f will be formed in the contact holes 11a, 11b, and 11g, and the field plate formation hole 11f in subsequent steps.

The contact holes 11a and 11b are located above the source/drain regions 8a and 8b, respectively. The contact hole 11g, which is not included in the cross section given in FIG. 1J, is located above the gate electrode 4g as illustrated in the plan view in FIG. 2. The electrically conductive via 14g to be formed in the contact hole 11g is also included in the plan view in FIG. 2. The field plate formation hole 11f is located above the flat portion of the silicide block layer 7s, which is located on the n-type well nw.

Using the resist pattern RP5 as mask, the insulation film 10b is etched until the insulation film 10a is exposed. This etching is carried out under appropriate conditions so that the insulation film 10b (which may be of silicon oxide) is selectively etched more strongly than the insulation film 10a (which may be of silicon nitride) while the insulation film 10a is acting as etching stopper.

The conditions for etching the insulation film 10b may be, for instance, as follows. As the etching gas, a mixture of $C_4F_6$, $O_2$, and Ar is used under the conditions of flow rates of 10 sccm to 30 sccm, 5 sccm to 20 sccm, and 500 sccm to 1,000 sccm for $C_4F_6$, $O_2$, and Ar, respectively, a pressure of 4 Pa to 11 Pa (30 mTorr to 80 mTorr) and a RF power of 2,000 W to 4,000 W.

Figure 2:
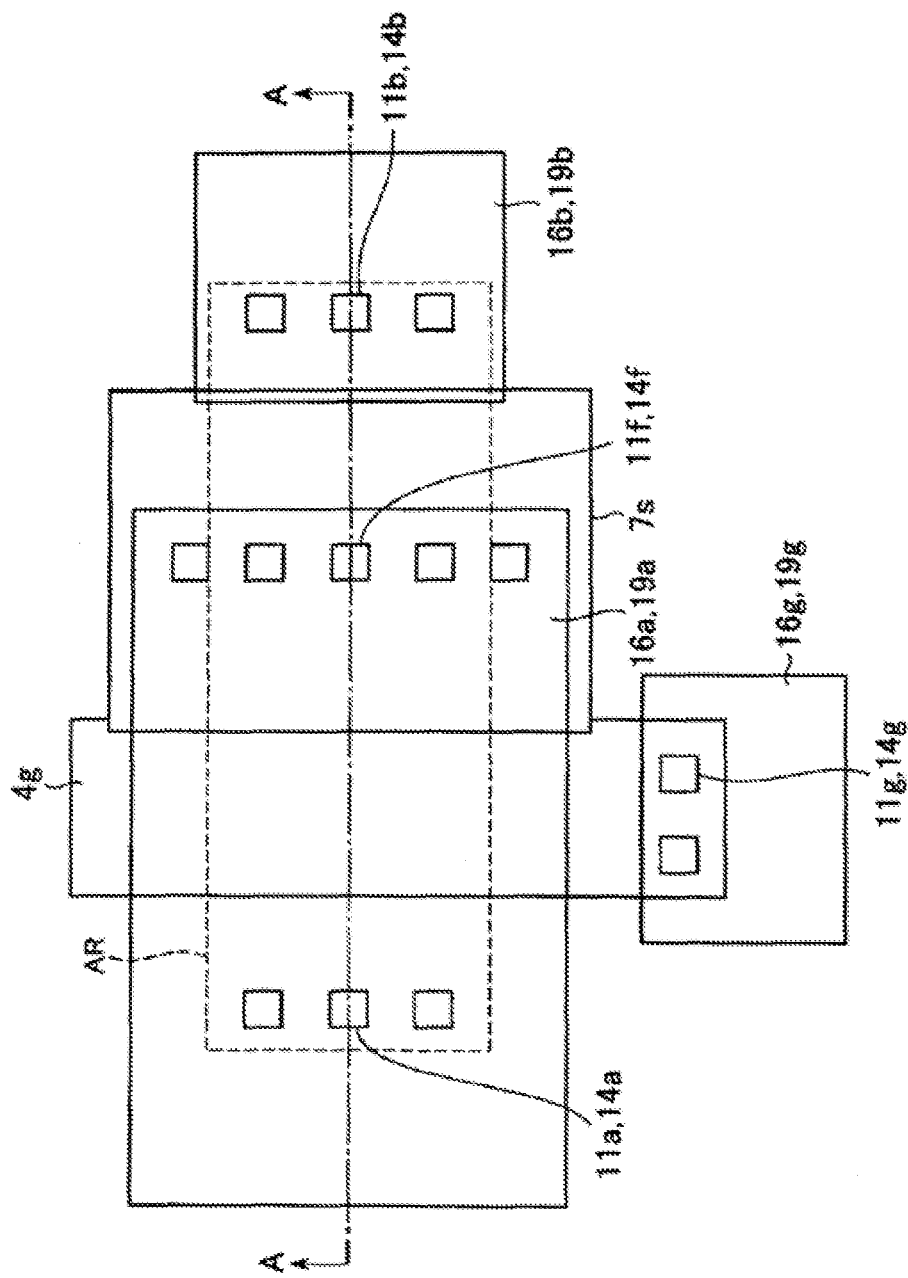
FIG. 2 is a schematic plan view of the semiconductor device according to the first embodiment.

The planar shape of the contact holes 11a, 11b, and 11g, or that of the electrically conductive vias 14a, 14b, and 14g is, for instance, a square (see also FIG. 2). The side Wa of the contact hole 11a, the side Wb of the contact hole 11b, and the side of the contact hole 11g are, for instance, about 100 nm to 160 nm (for instance, 130 nm).

The planar shape of the field plate formation hole 11f, or that of the field plate 14f, may not necessarily be the same as that of the electrically conductive via 14a etc., but if it is the same as that of the electrically conductive via 14a etc., the same etching conditions as for the contact hole 11a etc. can be applied to the etching of the field plate formation hole 11f, allowing the field plate formation hole 11f to be formed easily. In the first embodiment, the field plate 14f has the same planar shape as the electrically conductive via 14a etc., and it is, for instance, a square with a side Wf of 130 nm.

The distance W5 from the side face of the gate electrode 4g located above the n-type well nw to that of the field plate formation hole 11f (or of the field plate 14f) facing toward the gate electrode is, for instance, 200 nm.

Figure 1K:
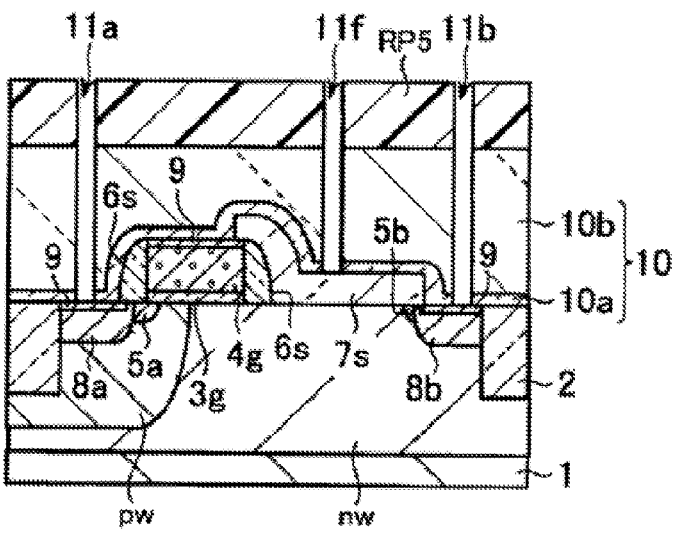

Refer to FIG. 1K. Still using the resist pattern RP5 as mask, the insulation film 10a is etched. The conditions for etching the insulation film 10a may be, for instance, as follows. As the etching gas, a mixture of $CH_3F$, $O_2$, and Ar is used under the conditions of flow rates of 30 sccm to 100 sccm, 10 sccm to 100 sccm, and 100 sccm to 300 sccm for $CH_3F$, $O_2$, and Ar, respectively, a pressure of 6.7 Pa to 27 Pa (50 mTorr to 200 mTorr) and a RF power of 300 W to 1,000 W. A resist pattern RP5 is removed after the etching of the insulation film 10a.

The contact holes 11a and 11b reach the source/drain regions 8a and 8b, respectively. The contact hole 11g reaches the gate electrode 4g. The field plate formation hole 11f reaches the silicide block layer 7s. Thus, the contact holes 11a, 11b, and 11g and the field plate formation hole 11f have been formed in the interlayer insulation film 10.

Figure 1L:
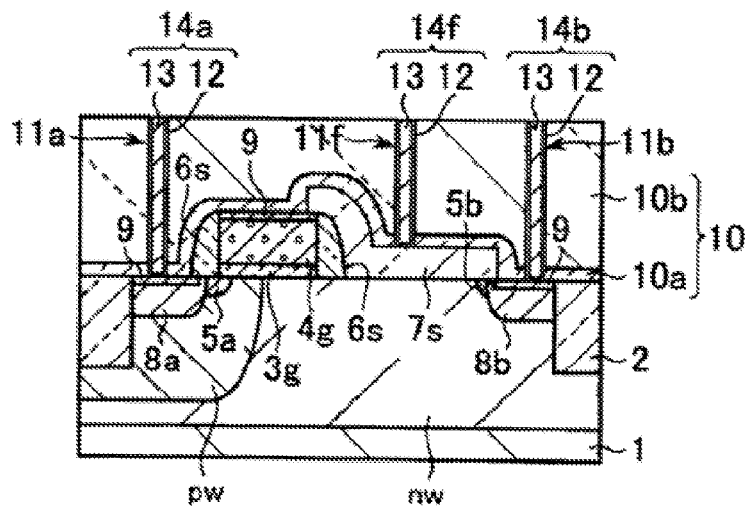

Refer to FIG. 1L. A glue layer 12 is formed on the interlayer insulation film 10 to cover the inside face of the contact holes 11a, 11b, and 11g and the field plate formation hole 11f. The glue layer 12 is formed by, for instance, carrying out sputtering to deposit a Ti film with a thickness of 10 nm to 20 nm and then sputtering to deposit a TiN film with a thickness 10 nm to 20 nm on the Ti film.

On the glue layer 12, furthermore, a tungsten (W) film 13 is deposited by, for instance, carrying out CVD to fill the contact holes 11a, 11b, and 11g and the field plate formation hole 11f. Then, the unnecessary portions of the tungsten (W) film 13 and the glue layer 12 on the interlayer insulation film 10 are removed by CMP to form electrically conductive vias 14a, 14b, and 14g in the contact holes 11a, 11b, and 11g while forming the electrically conductive member 14f in the field plate formation hole 11f.

The electrically conductive via 14a is electrically connected to the source/drain region 8a, the electrically conductive via 14b electrically connected to the source/drain region 8b, and the electrically conductive via 14g electrically connected to the gate electrode 4g. The field plate 14f is located on the silicide block layer 7s, which is an insulation film. The electrically conductive member 14f located on the silicide block layer 7s is referred to as field plate 14f.

Figure 1M:
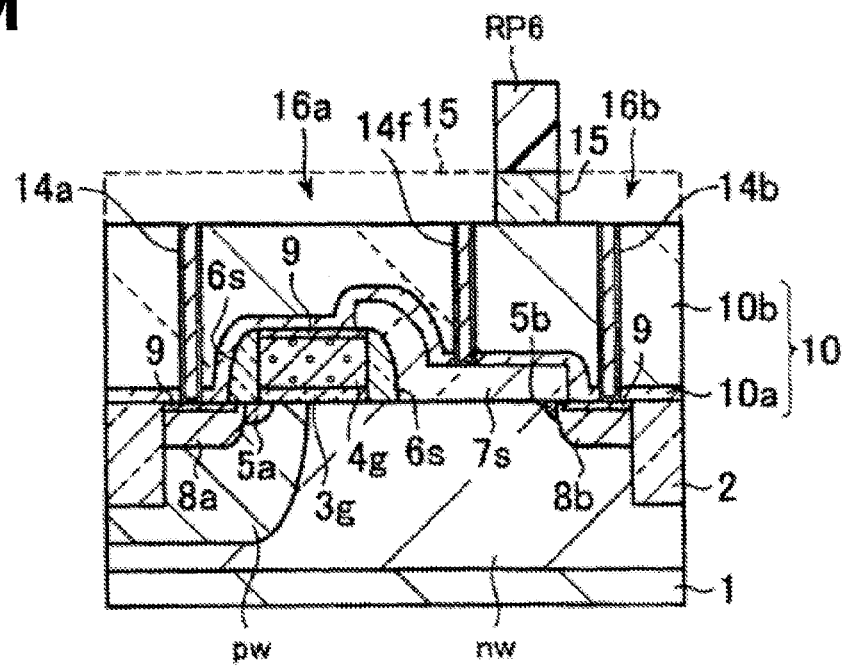
Figure 1N:
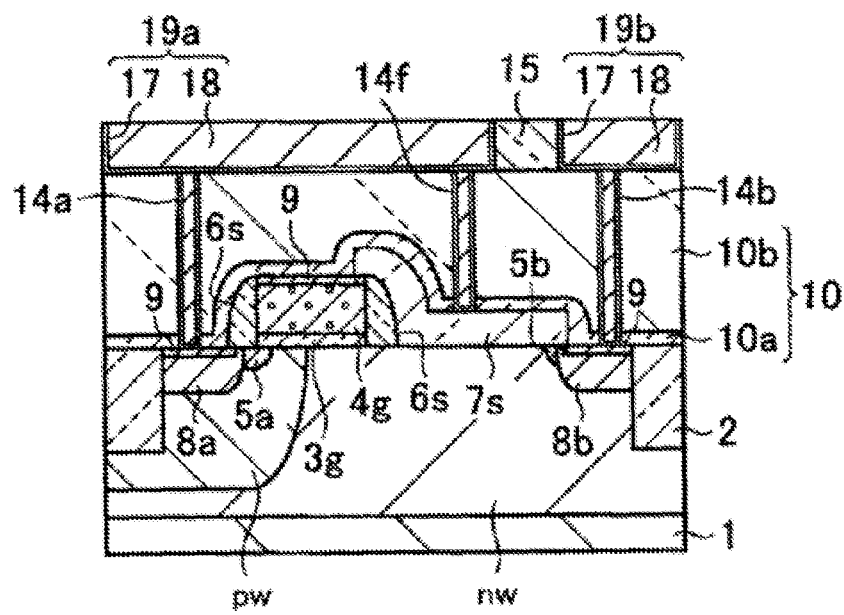

Refer to FIG. 1M. For instance, a silicon oxide film with a thickness of 150 nm is deposited on the interlayer insulation film 10 by CVD to form an interlayer insulation film 15. A resist pattern RP6 intended to produce openings for wiring is formed on the interlayer insulation film 15. Using the resist pattern RP6 as mask, the interlayer insulation film 15 is etched to form wiring grooves 16a, 16b, and 16g. Subsequently, the resist pattern RP6 is removed.

In the first embodiment, the wiring groove 16a exposes the electrically conductive via 14a that connects to the source/drain region 8a while also exposing the field plate 14f. The wiring groove 16b exposes the electrically conductive via 14b that connects to the source/drain region 8b.

The wiring groove 16g exposes the electrically conductive via 14g that connects to the gate electrode 4g. The wiring groove 16g, which is not included in the cross section given in FIG. 1M, is illustrated in the plan view in FIG. 2. Note that the wiring 19g to be formed in the wiring groove 16g in a subsequent step is also included in the plan view in FIG. 2.

Refer to FIG. 1N. A barrier metal film 17 is formed on the interlayer insulation film 15 to cover the inner faces of the wiring grooves 16a, 16b, and 16g. The barrier metal film 17 is formed by, for instance, sputtering to deposit a TaN film or a Ta film with a thickness 5 nm to 20 nm.

For instance, a seed layer is formed on the barrier metal film 17 by sputtering to deposit a Cu film with a thickness of 20 nm. On the seed layer, a Cu film 18 is deposited by electrolytic plating to fill the wiring grooves 16a, 16b, and 16g. Then, the unnecessary portions of the Cu film 18, seed layer, and barrier metal layer 17 on the interlayer insulation film 15 are removed by CMP to form the wirings 19a, 19b, and 19g in the wiring grooves 16a, 16b, and 16g.

The wiring 19a not only electrically connects to the electrically conductive via 14a, but also electrically connects the electrically conductive via 14a and the field plate 14f. The wirings 19b and 19g electrically connect to the conductive vias 14b and 14g, respectively.

Additional wirings may be formed on them by a generally known technique to produce a multi-layered wiring structure as required. Thus, the semiconductor device according to the first embodiment is formed.

FIG. 2 is a schematic plan view of the semiconductor device according to the first embodiment. The cross section views in FIGS. 1A to 1N illustrate the AA cross section defined in FIG. 2. The broken line defines the active region AR (the boundary of the element-separating insulation film 2). With the gate electrode 4g and silicide block layer 7s sandwiched in between, the electrically conductive via 14a that connects to the source/drain region 8a is formed outside the gate electrode 4g while the electrically conductive via 14b that connects to the source/drain region 8b is formed outside the silicide block layer 7s. The electrically conductive via 14g connects to one of the lateral end portions of the gate electrode 4g. The field plate 14f is located on the silicide block layer 7s.

Actually, several electrically conductive vias 14a, several electrically conductive vias 14b, and several field plates 14f are arranged in alignment in the width direction of the gate electrode. In the first embodiment, several field plates 14f are arranged in alignment in the width direction of the gate electrode.

The gaps between the adjacent electrically conductive vias 14a, those between the adjacent electrically conductive vias 14b, and those between the adjacent field plates 14f aligned in the gate's width direction may be set appropriately as required and, for instance, they may be the same as the sides of the electrically conductive vias 14a and 14b and field plates 14f, which may be, for instance, 130 nm.

In the first embodiment, the wiring 19a that connects to the electrically conductive vias 14a also connects to the field plates 14f. The wirings 19b and 19g connect to the electrically conductive vias 14b and 14g, respectively.

For instance, a voltage of 0V to 5V (for instance, 0V) is applied to the wiring 19a while a high voltage of 10V to 200V (for instance, 80V) is applied to the wire 19b, so that the source/drain region 8a connecting to the electrically conductive vias 14a acts as source while the source/drain region 8b connecting to the electrically conductive vias 14b acts as drain. For instance, a voltage of 0V to 5V (for instance, 0V) is applied to the wiring 19g that connects to the gate electrode 4g. In the first embodiment, a voltage of, for instance, 0V may be applied to the field plates 14f as well as to the electrically conductive vias 14a.

Described next is the electric field concentration reduction effect of the field plate 14f according to the first embodiment.

FIGS. 3A to 3C are schematic diagrams of the electric field and equipotential lines, respectively, in the vicinity of the gate electrode GT. In each figure, a graph of the electric field on the silicon substrate surface is given in the upper part while a graph of equipotential lines superimposed on a cross section in the thickness direction is given in the lower part. The horizontal direction is the gate's length direction, and the source and the drain are located to the left and to the right, respectively. The electric potential increases from the gate electrode toward the drain.

FIG. 3A is a diagram for the first comparative example where a field plate FP is not formed. In the first comparative example, the electric field intensity in the gate's length direction is very high in the vicinity of the drain-side edge portion of the gate electrode GT, suggesting that significant electric field concentration is taking place.

FIG. 3B is a diagram for the second comparative example where a field plate FP is formed, but the insulation film under the field plate FP has the same thickness as that of the gate insulation film, causing the bottom face of the gate electrode GT to be flush with that of the field plate FP. In the second comparative example, the application of an electric potential to the field plate FP works to relax the electric field concentration in the vicinity of the drain-side edge portion of the gate electrode GT. Electric field concentration, however, takes place in the vicinity of the drain-side edge portion of the field plate FP. It can be seen that the intervals between the equipotential lines in the thickness direction are small and the electric field intensity is high under the field plate FP (in the insulation film). As a result, dielectric breakdown is more likely to occur in the thickness direction of the insulation film.

FIG. 3C is a diagram for the first embodiment where the insulation film (silicide block layer) located under the field plate FP is thicker than the gate insulation film, and the bottom face of the field plate FP is at a higher level than that of the gate electrode GT.

In the first embodiment, the electric field concentration in the gate's length direction is relaxed in the vicinity of the drain-side edge portion of the gate electrode GT and in the vicinity of the drain-side edge portion of the field plate FP. In addition, the electric field concentration in the thickness direction under the field plate FP is relaxed and the dielectric breakdown is depressed.

Figure 4:
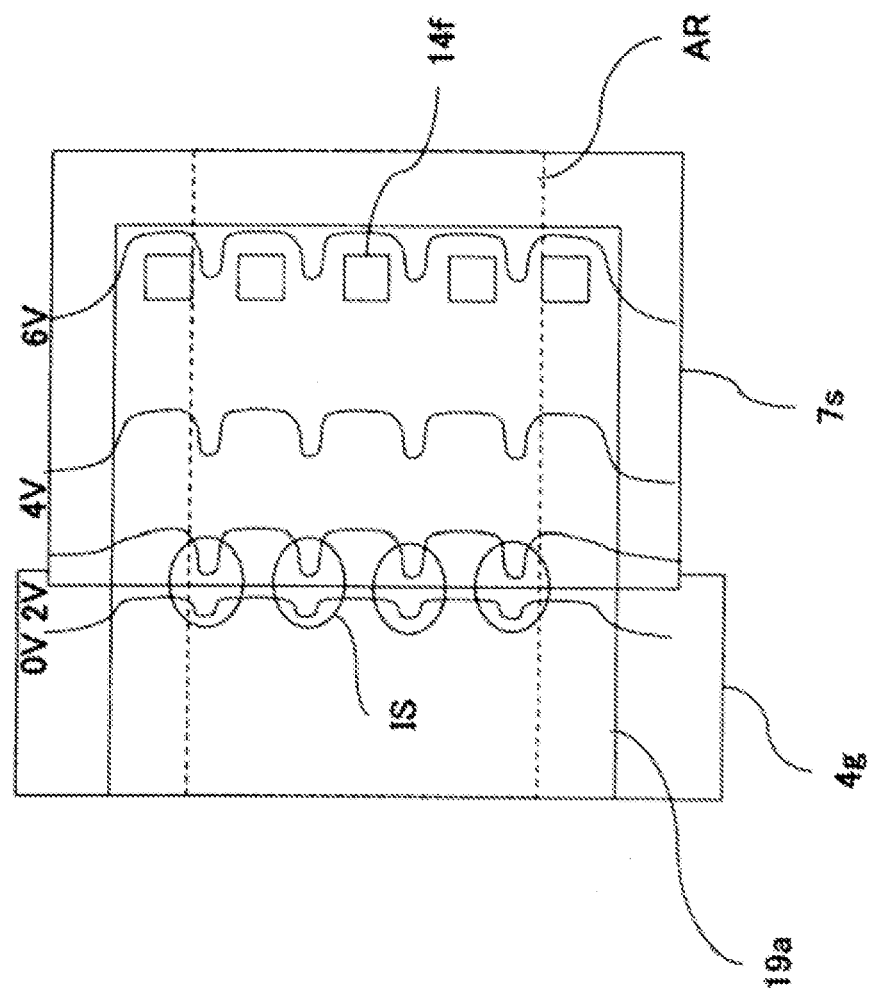
FIG. 4 illustrates equipotential lines drawn on top of a schematic plan view of an area ranging from the gate electrode toward the drain in the semiconductor device according to the first embodiment.

FIG. 4 illustrates equipotential lines drawn on top of a schematic plan view of an area ranging from the gate electrode toward the drain in the semiconductor device according to the first embodiment. Equipotential lines for 0V, 2V, 4V, and 6V are illustrated.

With respect to the equipotential lines for 0V and 2V in the vicinity of the drain-side edge portion of the gate electrode 4g, the circled areas IS correspond to the gaps between the field plates 14f in the gate's width direction. The equipotential lines in the circled areas IS corresponding to the gaps between the field plates 14f are somewhat similar in shape to those seen in the case without field plates 14f. In the circled areas IS, the equipotential lines tend to have small intervals, indicating that electric field concentration remains. However, in the areas corresponding to the field plates 14f, it can be seen, in particular, that the intervals between the equipotential lines for 0V and 2V are larger, suggesting relaxation of electric field concentration.

The descriptions given above indicate that in the semiconductor device according to the first embodiment, electric field concentration is relaxed in the gate's length direction due to the presence of the field plates 14f.

Furthermore, the silicide block layer 7s located under the field plate 14f is thick enough (as compared with, for instance, the gate insulation film 3g) to serve for depressing dielectric breakdown in the thickness direction.

Since the silicide block layer 7s is formed independently of, for instance, the gate insulation film 3g, its thickness can be designed independently of, for instance, that of the gate insulation film 3g. In the process for producing a transistor with high withstanding voltage characteristics, furthermore, the silicide block layer 7s is originally formed as mask for the silicide formation step, and therefore, it eliminates the need to add a new step for the formation of an insulation film underlying the field plates 14f.

Note that for instance, the shape and arrangement of the field plates 14f may be changed as required to ensure an appropriate distribution of equipotential lines.

Figure 5:
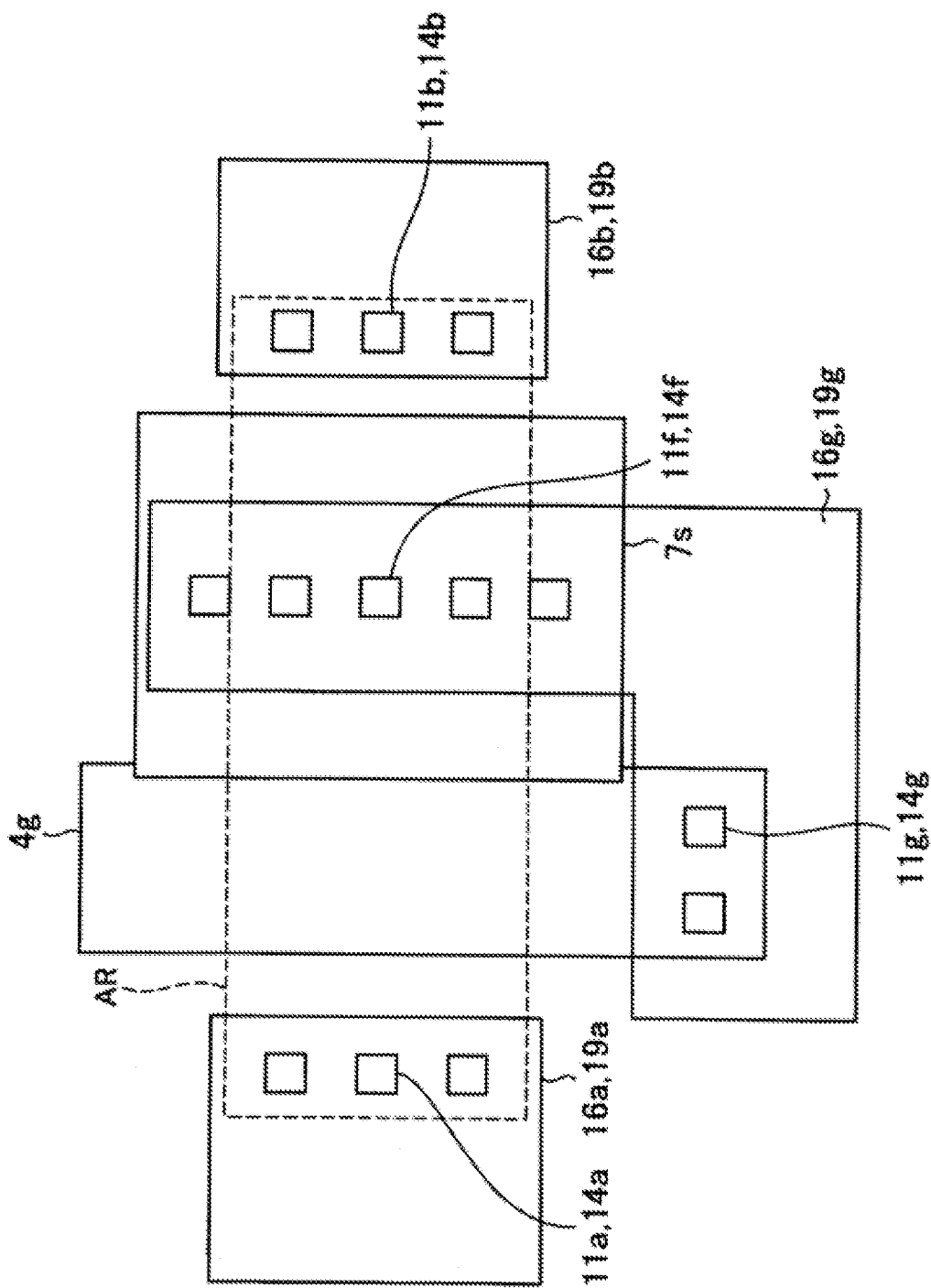
FIG. 5 is a schematic plan view of a semiconductor device according to a modified form of the first embodiment.

FIG. 5 is a schematic plan view of a semiconductor device according a modified form of the first embodiment. In the first embodiment, the conductive vias 14a and the field plates 14f are electrically connected with the wiring 19a as illustrated, for instance, in FIG. 2, and structured so that the voltage for the source region 8a is also applied to the field plates 14f.

As can be seen in FIG. 5, the modified form of the first embodiment is so structured that the electrically conductive via 14g and the field plates 14f are connected by the wiring 19g to allow the voltage for the gate electrode 4g to be also applied to the field plates 14f. The semiconductor device according to the modified form of the first embodiment can be produced by modifying the formation steps for the wire 19a etc. previously illustrated with reference to FIGS. 1M and 1N.

While a high voltage (for instance, 80V) is applied to the drain region 8b, the applied voltage is low not only for the source region 8a (for instance, 0V) but also for the gate electrode 4g (for instance, 0V). Accordingly, this wiring structure can also allow the field plates 14f to have the effect of improving the withstanding voltage characteristics such as previously illustrated with reference to FIGS. 3C and 4.

Describe next is the semiconductor device according to the second embodiment.

Figure 6:
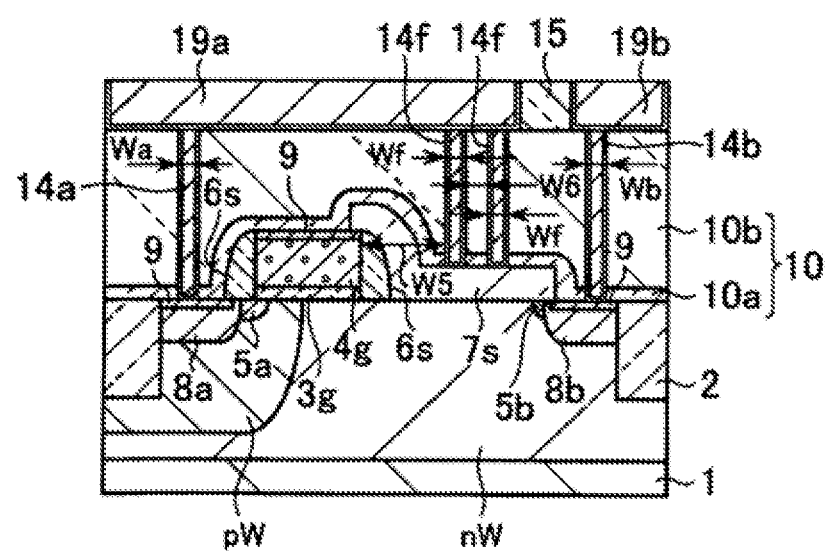
FIG. 6 is a schematic cross section of a semiconductor device according to the second embodiment.
Figure 7:
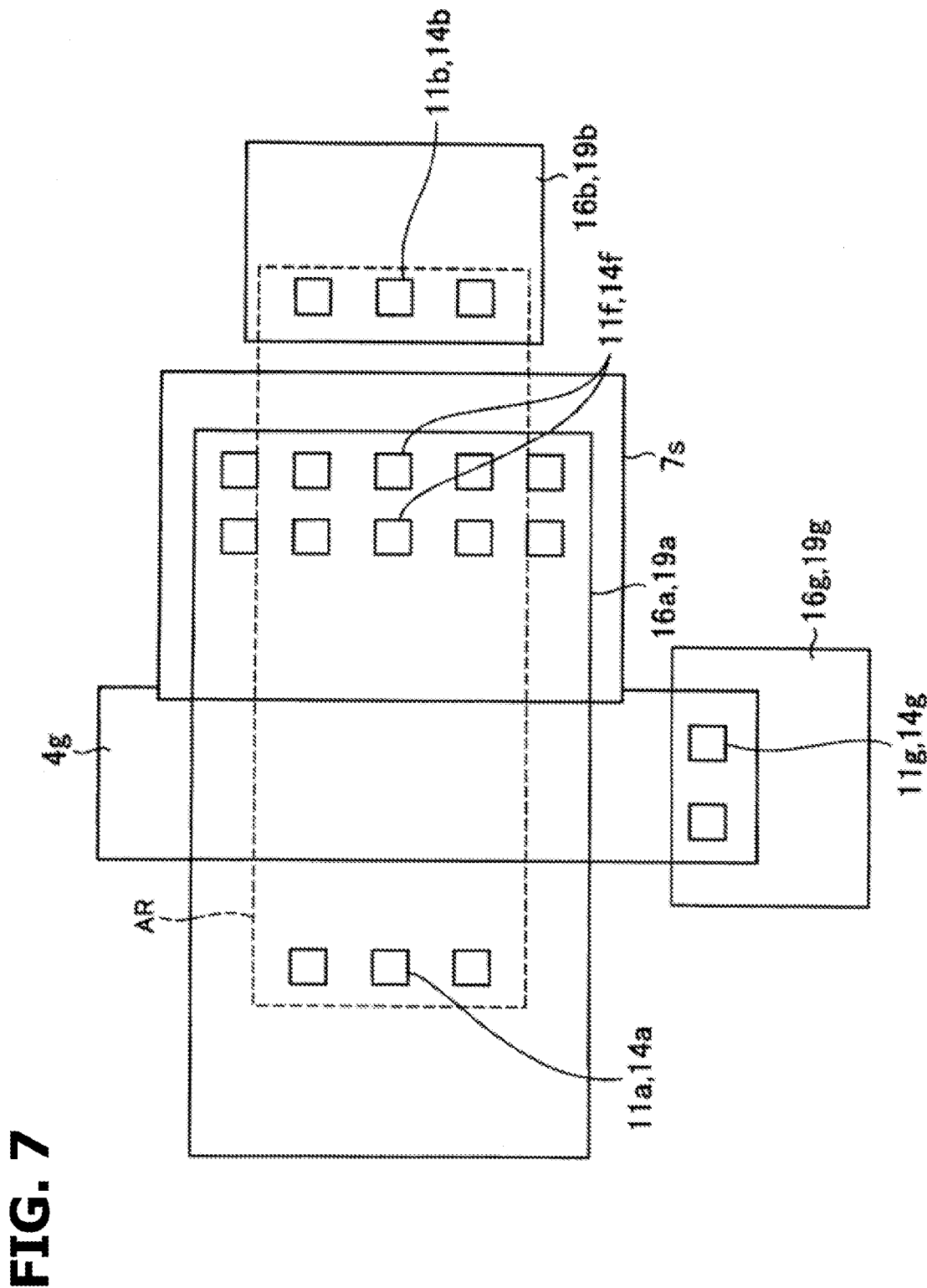
FIG. 7 is a schematic plan view of the semiconductor device according to the second embodiment.

FIGS. 6 and 7 are a schematic cross section and a plan view, respectively, of the semiconductor device according to the second embodiment.

Major differences from the first embodiment are described below. In the second embodiment, two lines of the field plates 14f, each consisting of two or more field plates aligned in the gate's width direction, are arranged in the gate's length direction. The two lines of the field plates 14f are electrically connected with the electrically conductive via 14a through the wiring 19a.

The shape and size of the electrically conductive vias 14a, 14b, and 14g are the same as for the first embodiment. The shape and size of each field plate 14f is also the same as for the first embodiment. The line of the field plates 14f that faces toward the gate is, as in the first embodiment, located away from the gate electrode 4g by a distance W5 of, for instance, 200 nm.

In the line of the field plates 14f that faces toward the drain, which is added in the second embodiment, the field plates 14f are arranged in the same way in the gate's width direction as the field plates 14f in the line that faces toward the gate. The distance W6 between the field plates 14f in the line that faces toward the gate and the field plates 14f in the line that faces toward the drain is set to, for instance, the same as the length of the side of the field plates 14f, which may be, for instance, 130 nm.

Describe next is the semiconductor device according to the third embodiment.

Figure 8:
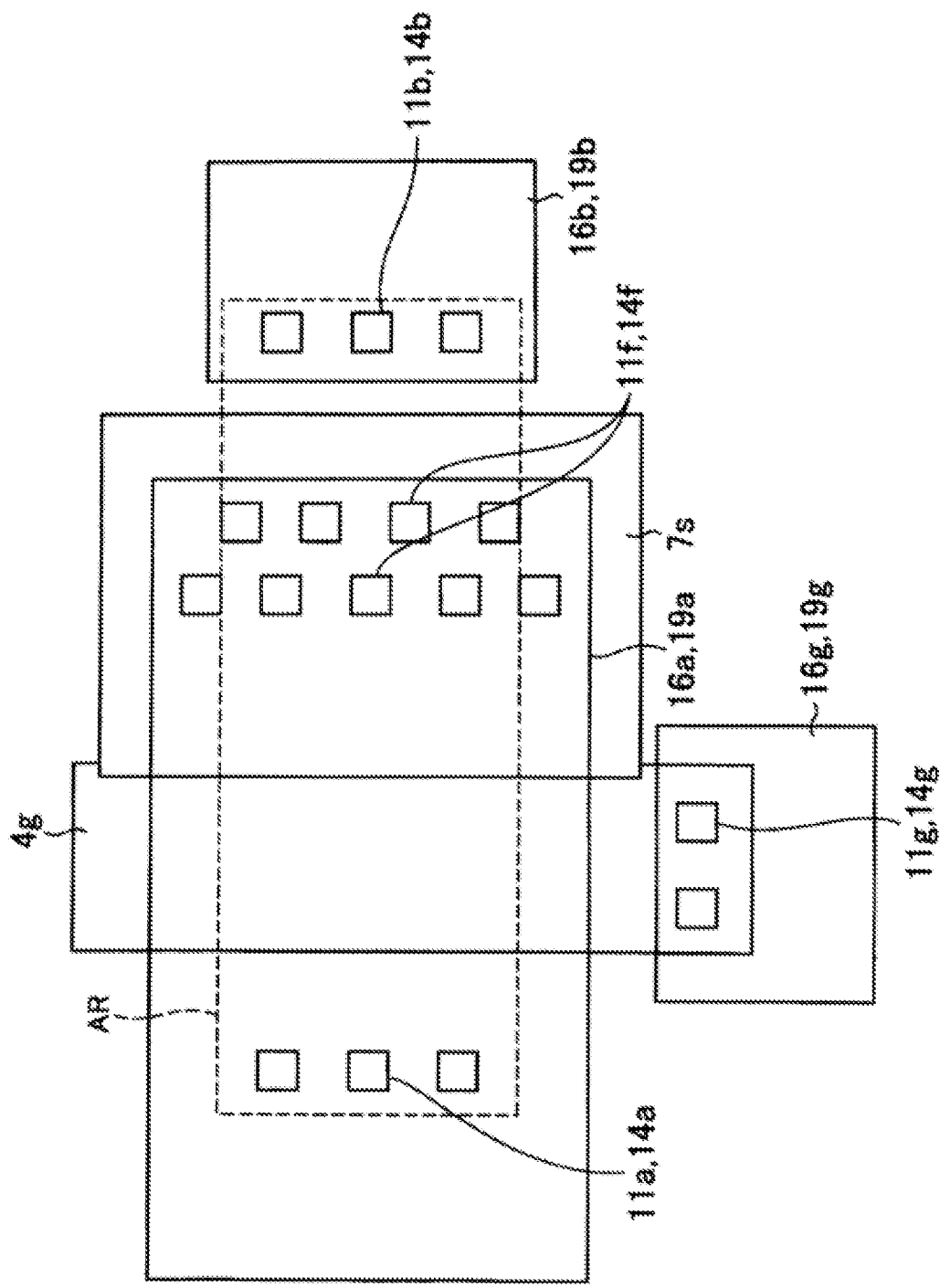
FIG. 8 is a schematic plan view of a semiconductor device according to the third embodiment.

FIG. 8 is a schematic plan view of the semiconductor device according to the third embodiment. In the third embodiment, as in the second embodiment, two lines of the field plates 14f, each consisting of two or more field plates aligned in the gate's width direction, are arranged in the gate's length direction, and the two lines of the field plates 14f are electrically connected to the conductive vias 14a through the wiring 19a. In the third embodiment, however, the field plates 14f in the gate-side line and those in the drain-side line are arranged alternately in the gate's width direction, resulting in smaller gaps between the field plates 14f in the gate's width direction.

Thus, a device may be so structured that two or more lines of the field plates 14f, each consisting of two or more field plates aligned in the gate's width direction, are arranged in the gate's length direction, as in the second and third embodiments. The number of the lines may be three or more as required.

Described next is the electric field concentration reduction effect of the field plates 14f in the second and third embodiments.

Figure 9A:
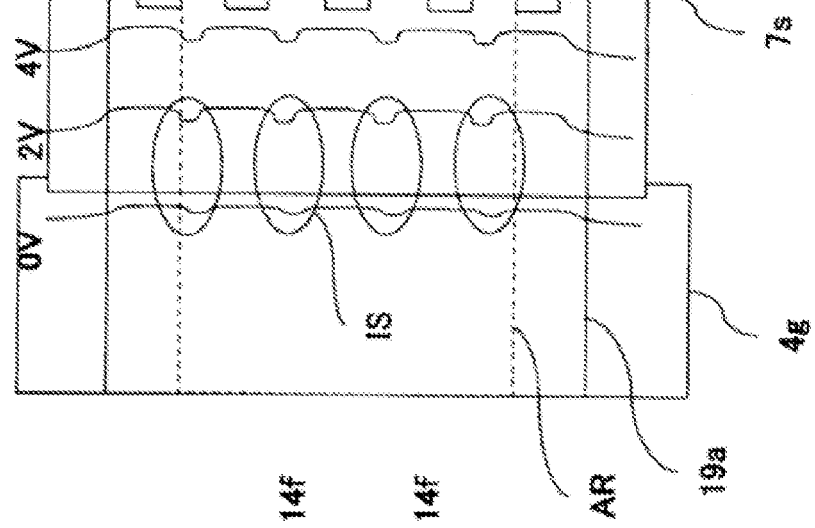
FIGS. 9A and 9B illustrate equipotential lines drawn on top of a schematic plan view of an area ranging from the gate electrode toward the drain in the semiconductor device according to the second and the third embodiment, respectively.
Figure 9B:
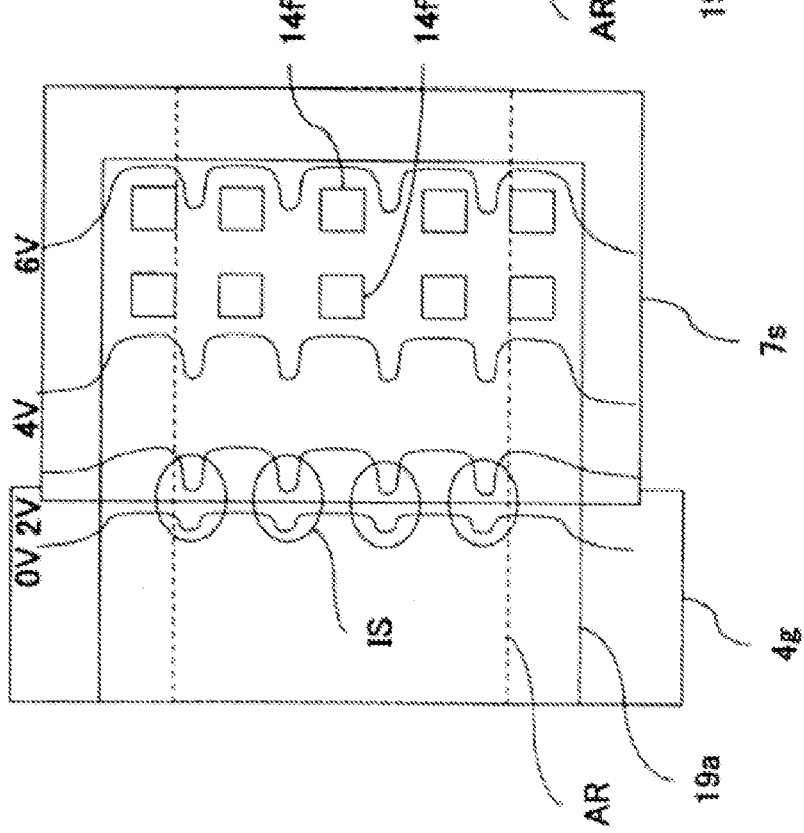

FIGS. 9A and 9B illustrate equipotential lines drawn on top of a schematic plan view of an area ranging from the gate electrode toward the drain in the semiconductor device according to the second and the third embodiment, respectively. Equipotential lines for 0V, 2V, 4V, and 6V are illustrated. With respect to the equipotential lines for 0V and 2V in the vicinity of the drain-side edge portion of the gate electrode 4g, circled areas IS correspond to the gaps in the gate's width direction between the field plates 14f in the line facing toward the gate.

The second embodiment has nearly the same electric field concentration reduction effect as the first embodiment (see FIG. 4), but in the circled areas IS, the intervals between equipotential lines are short, indicating that electric field concentration tends to remain as in the case of the first embodiment.

In the third embodiment, the field plates 14f aligned in two lines are arranged alternately in the gate's width direction, and when looking at the overall arrangement of the field plates 14f, the gaps between the field plates 14f are small with respect to the gate's width direction. This increases the intervals between the equipotential lines in the circled areas IS as compared with the second embodiment (or the first embodiment) to enhance the effect of reducing electric field concentration.

Note that in the second and third embodiments, the electrically conductive via 14g and the field plates 14f may also be connected through the wiring 19g as in the case of the modified form of the first embodiment.

The semiconductor devices according to the second and third embodiments or their modified forms can be produced by the same procedure as for the semiconductor device according to the first embodiment. The production process for the first embodiment may be modified appropriately to fit modifications in the arrangement of the field plates 14f or the shapes of the wirings 19a and 19g.

Describe next is the semiconductor device according to the fourth embodiment.

FIG. 10 is a schematic plan view of the semiconductor device according to the fourth embodiment. One long field plate 14f elongated in the gate's width direction is formed in the fourth embodiment, instead of arranging two or more field plates 14f in lines in the gate's width direction as in the case of the first to third embodiments.

Figure 11A:
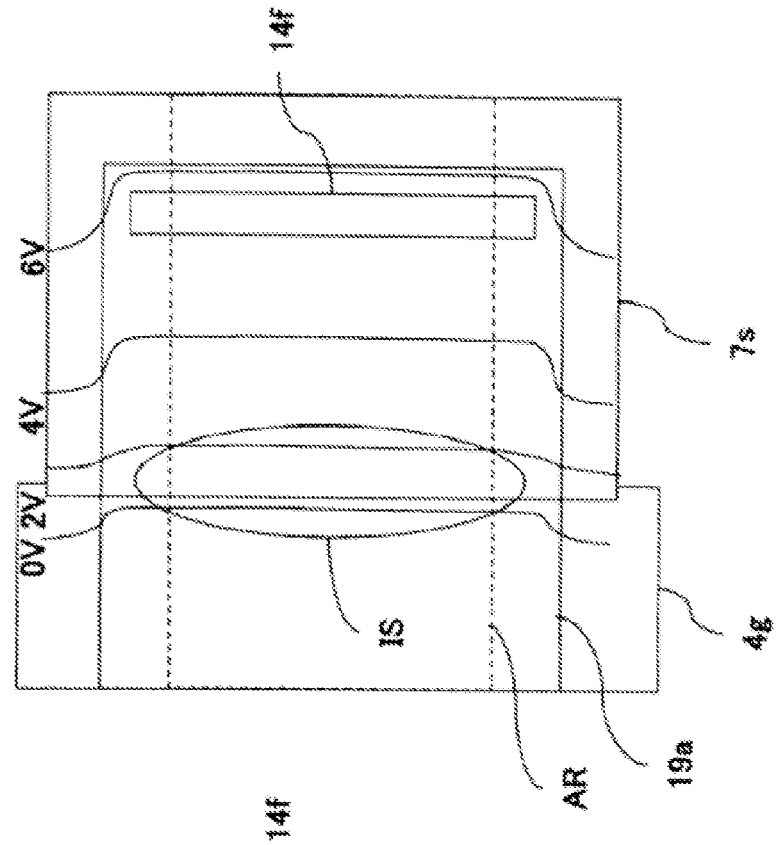
FIGS. 11A and 11B illustrate equipotential lines drawn on top of a schematic plan view of an area ranging from the gate electrode toward the drain in the semiconductor device according to the first and the fourth embodiment, respectively.
Figure 11B:
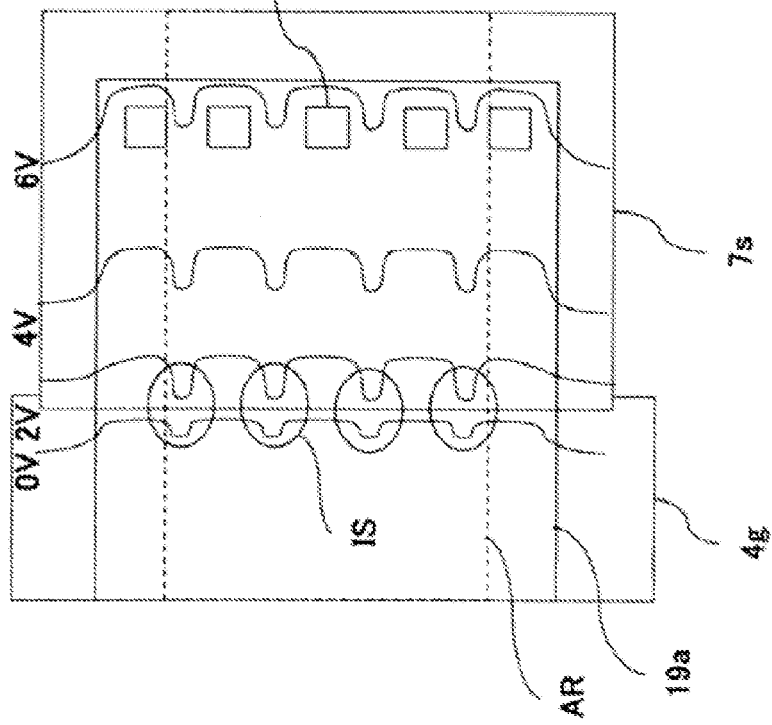

FIGS. 11A and 11B illustrate equipotential lines drawn on top of a schematic plan view of an area ranging from the gate electrode toward the drain in the semiconductor device according to the first and the fourth embodiment, respectively. Equipotential lines for 0V, 2V, 4V, and 6V are illustrated. The diagram for the first embodiment given in FIG. 11A is the same as that in FIG. 4, but it is presented here for comparison with the diagram for the fourth embodiment given in FIG. 11B. In FIG. 11B, the circled area IS indicates the equipotential lines for 0V and 2V in the vicinity of the drain-side edge portion of the gate electrode 4g.

The field plate 14f according to the fourth embodiment is free from gaps in the gate's width direction. Accordingly, electric field concentration attributed to the gaps between the field plates 14f in the gate's width direction as seen in the first embodiment is depressed, achieving uniform electric field concentration reduction effect in the gate's width direction.

Note that in the fourth embodiment, the electrically conductive via 14g and the field plate 14f may also be connected through the wiring 19g as in the case of the modified form of the first embodiment.

The semiconductor devices according to the fourth embodiment or its modified form can be produced by the same procedure as for the semiconductor device according to the first embodiment. In the fourth embodiment, the field plate 14f does not have the same shape as that of the electrically conductive via 14a etc., but appropriate etching conditions for simultaneous production of the contact hole 11a etc. and the field plate formation hole 11f are able to be found, for instance, based on experiments.

The wirings 19a, 19b, and 19g are formed of copper in the first to fourth embodiments, but these wirings may be formed of, for instance, aluminum instead of copper.

In the production process described for the first embodiment, the silicide block layer 7s is used as mask for source/drain implantation as illustrated with reference to FIG. 1G. As a modified form of this production process, there are other adoptable processes that do not use the silicide block layer 7s as mask for source/drain implantation, as described below.

Figure 12A:
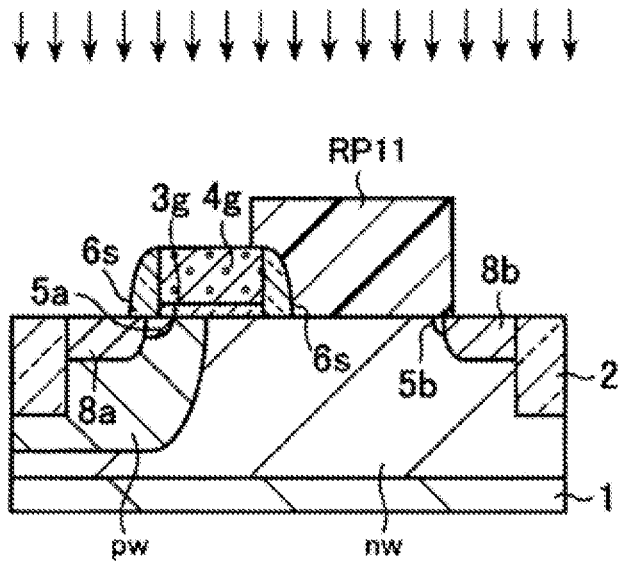
FIGS. 12A and 12B are schematic cross sections illustrating major production steps for a modified device.
Figure 12B:
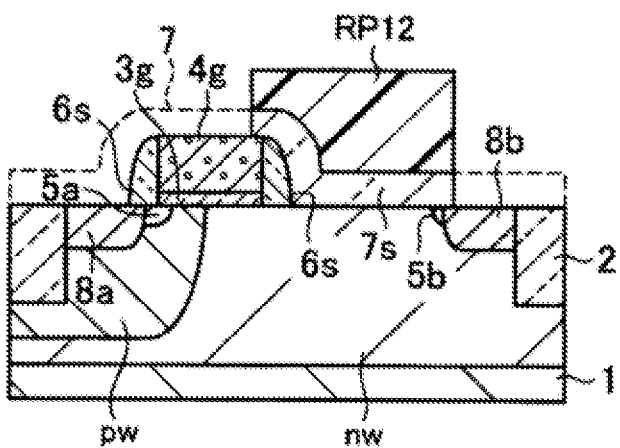

FIGS. 12A and 12B are schematic cross sections of a semiconductor device illustrating the production process according to the modified embodiment. First, the same steps as illustrated in FIGS. 1A to 1E for the first embodiment are carried out to form the side wall spacers 6s and the antecedent parts.

Refer to FIG. 12A. A resist pattern RP11 which serves as mask for source/drain implantation is formed on the n-type well nw. Source/drain regions 8a and 8b are formed by carrying out source/drain implantation using the side wall spacer 6s on the p-type well pw, gate electrode 4g, and resist pattern RP11 as mask. Subsequently, the resist pattern RP11 is removed.

The resist pattern RP11 is located on the n-type well nw and extends to the edge of the gate electrode 4g facing toward the n-type well nw in the same way as described previously for the silicide block layer 7s used as mask for source/drain implantation. The source/drain implantation conditions may be, for instance, the same as those used previously in the case where the silicide block layer 7s is used as mask.

Refer to FIG. 12B. After the source/drain implantation, a silicide block layer 7s is formed by the same procedure as described previously with reference to FIG. 1F (the resist pattern RP12 in FIG. 12B corresponding to the resist pattern RP4 in FIG. 1F). The silicide block layer 7s has a thickness of, for instance, 20 nm to 80 nm. After forming the silicide block layer 7s, the same procedure as described previously in FIG. 1H and the subsequent diagrams for the first embodiment to complete a semiconductor device.

This process relieves the silicide block layer 7s of requirements to serve as mask for source/drain implantation and, for instance, the thickness of the silicide block layer 7s can be decreased easily, allowing the silicide block layer 7s to have a preferred thickness selected from a wide thickness range for electric field relaxation.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device production method comprising:
   forming in a silicon substrate a first region of a first conductivity type and a second region of a second conductivity type which is in contact with the first region;
   forming a gate electrode above the first region and the second region;
   forming an insulation film extending from the gate electrode to the second region to cover part of the gate electrode and part of the second region;
   forming a source region and a drain region by implanting impurity of the second conductivity type into the silicon substrate using the gate electrode as mask;
   forming a metal layer on the silicon substrate to cover the gate electrode and the insulation film;
   performing heat treatment after the metal layer formation to produce silicide on the source region, on the drain region, and on the gate electrode;
   after performing heat treatment, forming on the silicon substrate an interlayer insulation film to cover the gate electrode and the insulation film;
   forming in the interlayer insulation film a first contact hole reaching the source region, a second contact hole reaching the drain region, a third contact hole reaching the gate electrode, and at least one additional hole reaching the insulation film; and
   forming a conductive film in the first, the second, and the third contact hole and the additional hole to form a first, a second and a third electrically conductive via in the first, the second, and the third contact hole and to form an electrically conductive member in the additional hole.

2. The semiconductor device production method according to claim 1, further comprising forming a wiring to electrically connect the first electrically conductive via and the electrically conductive member.

3. The semiconductor device production method according to claim 1, further comprising forming a wiring to electrically connect the third electrically conductive via and the electrically conductive member.

4. The semiconductor device production method according to claim 1, further comprising forming a gate insulation film on the silicon substrate, wherein the insulation film is larger in thickness than the gate insulation film.

5. The semiconductor device production method according to claim 1, wherein the forming of the interlayer insulation film comprises forming a first insulation film to act as etching stopper and forming a second insulation film on the first insulation film, and
   the forming of the first, the second and the third contact hole and the hole reaching the insulation film comprises etching the second insulation film using the first insulation film as stopper and etching the first insulation film after the etching of the second insulation film.

6. The semiconductor device production method according to claim 5, wherein the insulation film and the second insulation film are formed of silicon oxide while the first insulation film is formed of silicon nitride.

7. The semiconductor device production method according to claim 1, wherein the at least one additional hole is a plurality of additional holes, and the additional holes are formed at positions distributed in a gate's width direction.

8. The semiconductor device production method according to claim 1, wherein the forming of the source region and the drain region is achieved by implanting impurity using the insulation film and the gate electrode as mask.

9. The semiconductor device production method according to claim 1, wherein the additional hole has the same planar shape as that of the first contact hole, the second contact hole, and the third contact hole.

10. The semiconductor device production method according to claim 1, further comprising, after the forming of the gate electrode and before the forming of the insulation film, forming a resist layer extending from the gate electrode to the second region to cover part of the gate electrode and part of the second region, and implanting impurity of the second conductivity type into the silicon substrate using the gate electrode and the resist layer as mask to form a first impurity region lower in concentration than the source region and a second impurity region lower in concentration than the drain region.

11. The semiconductor device production method according to claim 10, further comprising, after the forming of the first impurity region and the second impurity region and before the forming of the insulation film, forming a side wall spacer insulation film on the side face of the gate electrode.

12. The semiconductor device production method according to claim 11, wherein the forming of an insulation film is achieved by forming the insulation film to cover the side wall spacer insulation film on the side face of the gate electrode facing toward the second region, and the forming of a source region and a drain region is achieved by implanting impurity of the second conductivity type using as mask the side wall spacer insulation film on the side face of the gate electrode facing toward the first region together with the gate electrode and the insulation film.

\* \* \* \* \*